United States Patent
Ramm et al.

(10) Patent No.: US 9,642,276 B2
(45) Date of Patent: May 2, 2017

(54) WELDING AND SOLDERING OF TRANSISTOR LEADS

(71) Applicant: Tesla Motors, Inc., Palo Alto, CA (US)

(72) Inventors: Robert James Ramm, Mountain View, CA (US); Dino Sasaridis, San Francisco, CA (US); Colin Campbell, San Francisco, CA (US); Wenjun Liu, Santa Clara, CA (US)

(73) Assignee: Tesla, Inc., Palo Alto, CA (US)

( * ) Notice: Subject to any disclaimer, the term of this patent is extended or adjusted under 35 U.S.C. 154(b) by 91 days.

(21) Appl. No.: 14/557,381

(22) Filed: Dec. 1, 2014

(65) Prior Publication Data

US 2016/0157374 A1 Jun. 2, 2016

(51) Int. Cl.
*H05K 7/06* (2006.01)
*H05K 3/34* (2006.01)
*H05K 7/14* (2006.01)

(52) U.S. Cl.
CPC ............. *H05K 7/06* (2013.01); *H05K 3/3447* (2013.01); *H05K 7/1432* (2013.01)

(58) Field of Classification Search
CPC .......... H05K 7/06; H05K 3/34; H05K 3/3447; H05K 2201/10272; H05K 7/1432
See application file for complete search history.

(56) References Cited

U.S. PATENT DOCUMENTS

| | | | | |
|---|---|---|---|---|
| 5,422,440 A | * | 6/1995 | Palma | H02M 7/003 174/133 B |
| 6,359,331 B1 | * | 3/2002 | Rinehart | H01L 23/642 257/691 |
| 6,489,567 B2 | * | 12/2002 | Zachrai | H02G 5/025 174/149 B |
| 8,199,520 B2 | * | 6/2012 | Kishino | H05K 1/144 174/50.52 |
| 8,383,939 B2 | * | 2/2013 | Gotou | H02M 7/003 174/68.2 |
| 8,400,775 B2 | * | 3/2013 | Ward | H02M 7/003 361/763 |
| 9,257,825 B2 | * | 2/2016 | Kalayjian | H05K 7/1432 |
| 2008/0130223 A1 | * | 6/2008 | Nakamura | H02M 7/003 361/689 |

(Continued)

FOREIGN PATENT DOCUMENTS

FR 2976424 A1 * 12/2012 ............. H05K 1/141

*Primary Examiner* — Nathan Milakovich
(74) *Attorney, Agent, or Firm* — Garlick & Markison; Bruce E. Garlick

(57) ABSTRACT

In a method of manufacturing an electronic device a transistor having respective input, output and control leads extending parallel to each other is positioned; first and second busbar layers are placed relative to the transistor so that a first tab extending from the first opening aligns with and contacts one of the input and output leads, and so that a second tab extending from the second opening aligns with and contacts another one of the input and output leads; the first tab and one of the input and output leads are welded; a circuit board is placed parallel to the busbar layers so that the control lead and the first and second tabs extend through corresponding openings in the circuit board; and the control lead and the at least one of the first and second tabs are soldered to one or more circuits on the circuit board.

14 Claims, 4 Drawing Sheets

(56) References Cited

U.S. PATENT DOCUMENTS

| | | |
|---|---|---|
| 2011/0254512 A1 | 10/2011 | Nergaard |
| 2012/0194119 A1 | 8/2012 | Kroeze et al. |
| 2012/0305283 A1* | 12/2012 | Kalayjian ............ H05K 7/1432 174/68.2 |
| 2013/0211579 A1 | 8/2013 | Kalayjian |
| 2015/0037634 A1* | 2/2015 | Malcolm ............. H01M 10/482 429/90 |
| 2015/0124379 A1* | 5/2015 | Bruchmann ............. H02B 1/18 361/624 |
| 2016/0155572 A1* | 6/2016 | Ramm .................... H01G 4/40 361/782 |
| 2016/0156278 A1* | 6/2016 | Ramm .................. H02M 7/003 361/624 |

\* cited by examiner

WELDING AND SOLDERING OF TRANSISTOR LEADS

BACKGROUND

Active switching devices such as transistors are used in a number of different contexts. One example is in the area of power inverters, where each transistor typically receives high-voltage DC input and generates AC as an output. The transistor has high-voltage connections to its input and output leads, and must also receive control input on a separate lead, which is sometimes provided by way of a circuit board that is part of the inverter. In designing a compact yet powerful inverter that can be manufactured in an automated and efficient manner, the geometry of the various electrical connections to and from the respective transistors plays a major role.

SUMMARY

In a first aspect, a method of manufacturing an electronic device includes: positioning a transistor having respective input, output and control leads extending parallel to each other, the control lead longer than the input and output leads; placing at least first and second busbar layers relative to the transistor so that the input, output and control leads extend through a first opening in the first busbar layer and through a second opening in the second busbar layer, the first and second busbar layers placed so that a first tab extending from the first opening aligns with and contacts one of the input and output leads, and so that a second tab extending from the second opening aligns with and contacts another one of the input and output leads; welding the first tab and the one of the input and output leads to each other, and the second tab and the other one of the input and output leads to each other; placing a circuit board parallel to the first and second busbar layers so that the control lead and at least one of the first and second tabs extend through corresponding openings in the circuit board; and soldering the control lead and the at least one of the first and second tabs to one or more circuits on the circuit board.

Implementations can include any or all of the following features. Placing the first and second busbar layers relative to the transistor comprises positioning the first busbar layer relative to the transistor, placing an insulation layer on the positioned first busbar layer, and placing the second busbar layer on the placed insulation layer. The method further comprises placing a third busbar layer relative to the transistor so that the input, output and control leads extend through a third opening in the third busbar layer. The electric device comprises multiple transistors having respective input, output and control leads extending parallel to each other, wherein the first, second and third busbar layers are placed in a corresponding way relative to all of the transistors. The first, second and third busbar layers are initially assembled into a laminate busbar structure where they are separated by insulation, and wherein the laminate busbar structure is placed relative to the transistor before welding the first and second tabs. The input, output and control leads are initially of equal length, the method further comprising shortening the input and output leads.

In a second aspect, an electronic device includes: a transistor having respective input, output and control leads extending parallel to each other, the control lead longer than the input and output leads; at least first and second busbar layers placed relative to the transistor so that the input, output and control leads extend through a first opening in the first busbar layer and through a second opening in the second busbar layer, the first and second busbar layers placed so that a first tab extending from the first opening aligns with and contacts one of the input and output leads, and so that a second tab extending from the second opening aligns with and contacts another one of the input and output leads; a circuit board placed parallel to the first and second busbar layers so that the control lead and at least one of the first and second tabs extend through corresponding openings in the circuit board; wherein the first tab and the one of the input and output leads are connected to each other by a first weld joint, and the second tab and the other one of the input and output leads are connected to each other by a second weld joint; and wherein the control lead and the at least one of the first and second tabs are connected to one or more circuits on the circuit board by solder joints.

Implementations can include any or all of the following features. The electronic device further comprises an insulation layer separating the first busbar layer from the second busbar layer. The electronic device further comprises a third busbar layer placed relative to the transistor so that the input, output and control leads extend through a third opening in the third busbar layer. The transistor is essentially perpendicular to each of the first and second busbar layers and the circuit board.

In a third aspect, an electronic device includes: a transistor having respective input, output and control leads extending parallel to each other, the control lead longer than the input and output leads; at least first and second busbar layers placed relative to the transistor so that the input, output and control leads extend through a first opening in the first busbar layer and through a second opening in the second busbar layer, the first busbar layer having first means for forming a first weld joint between one of the input and output leads and the first busbar layer, the second busbar layer having second means for forming a second weld joint between another one of the input and output leads and the second busbar layer; and a circuit board placed parallel to the first and second busbar layers so that the control lead and at least one of the first and second means extend through corresponding openings in the circuit board, wherein the control lead and the at least one of the first and second means are connected to one or more circuits on the circuit board by solder joints.

Implementations can include any or all of the following features. The first means comprises a first tab extending from the first opening. The first tab extends from a periphery of the first opening and is essentially parallel with the one of the input and output leads. The second means comprises a second tab extending from the second opening. The second tab extends from a periphery of the second opening and is essentially parallel with the other one of the input and output leads. Both of the first and second means extend through the corresponding openings in the circuit board and are connected to one or more circuits on the circuit board by solder joints.

DETAILED DESCRIPTION

This document describes examples of active components (e.g., transistors) being connected to busbars and circuit boards by one or more approaches that involve welding as well as soldering. Such techniques can provide a convenient way of transitioning from the transistor leads to busbar leads both electrically and physically. For example, the approach can allow a transistor to make a high-voltage connection to a busbar by way of a weld joint, as well as allow a tab from that welded juncture to continue onto a circuit board where it can be used as an electrical reference connection.

Figure 1:
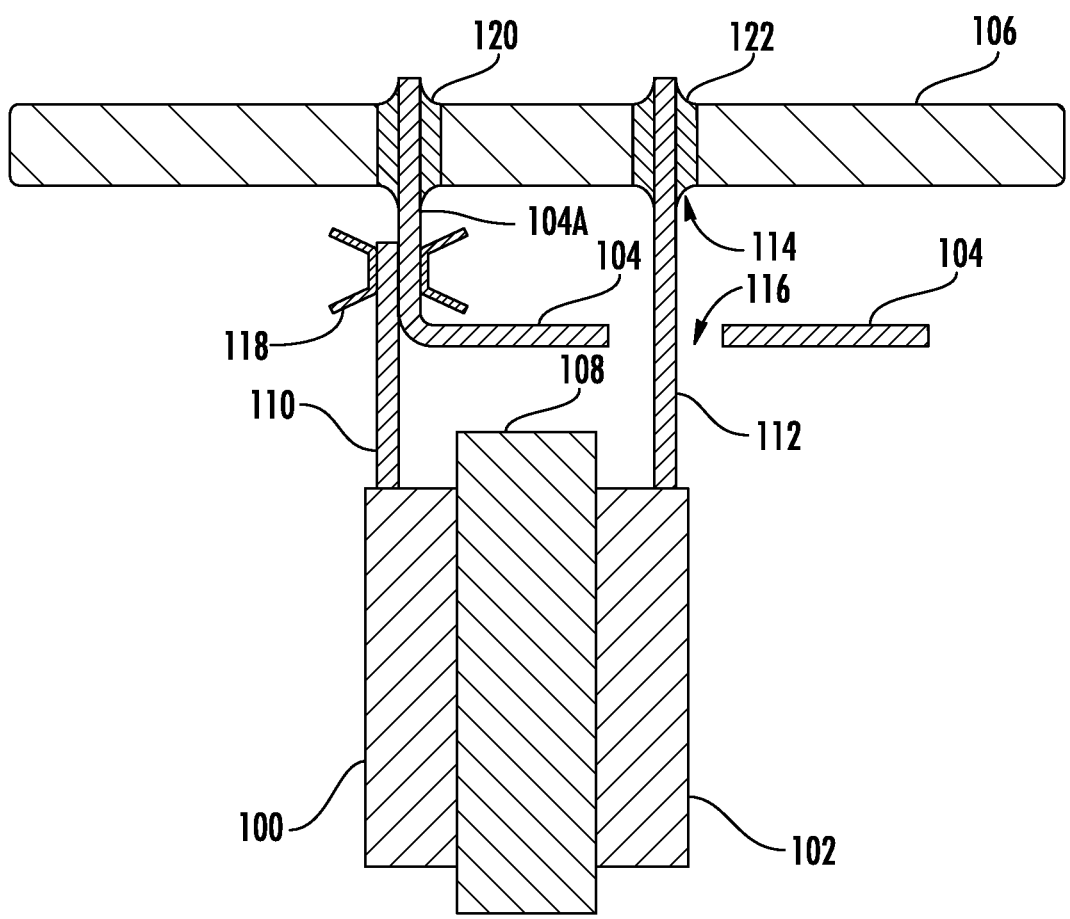
FIG. 1 shows an example of electronic components being welded to a busbar structure and soldered to a circuit board.

FIG. 1 shows an example of electronic components 100 and 102 having leads being welded to a busbar structure 104 and soldered to a circuit board 106. The electronic components (which can be any type of active component, e.g., IGBTs) are here positioned on opposite sides of a cooling structure 108 (e.g., a heatsink). The present configuration allows the transistors to be oriented in a perpendicular fashion to the busbar and the circuit board, as well as allows effective thermal management of the device. In this example, the two shown transistors are of the same type, each having respective input, output and control leads extending parallel to each other. As illustrated, an input lead 110 (e.g., a source lead) of the component 100 is visible. Similarly, a control lead 112 of the component 102 is visible.

While each of the components 100 and 102 has three leads, they can be of different length. In some implementations, the control lead is longer than the input and output leads. For example, the control lead 112 is here extending through an opening 114 in the circuit board 106, whereas the input lead 110 does not extend all the way to the circuit board.

An opening 116 in the busbar structure 104 allows the control lead to extend past that busbar without electrically connecting to it. For the most part, the busbar structure 104 is generally flat. In some places, however, it has one or more tabs formed therein to serve certain purposes. For example, a tab 104A is formed in the busbar structure so as to align with, and contact, the source lead 110 of the component 100. This configuration provides a convenient way to allow weld electrodes 118 to access the lead 110 and the tab 104A and form a weld joint between them. For example, this weld joint can serve as a high power connection between a transistor and one of the busbars.

Moreover, the fact that the tab 104A extends further than the (shortened) input lead 110 allows also a connection to the circuit board 106 to be made. In some implementations, this can serve as a control connection for the benefit of one or more components (not shown) on the circuit board. For example, a solder joint 120 can be formed between the tab 104A and a circuit on the board. That is, the tab facilitates the formation of a weld joint between the input lead and the busbar structure, and can thereby provide both an electrical and a physical transition from the transistor lead to the busbar lead. While only the input lead 110 of the component 100 was discussed above, it will be understood that the other leads of the component 100 are connected in a corresponding fashion. For example, an output lead of the component 100 can be connected to another busbar layer (not shown), and a control lead of the component 100 can be connected to the circuit board 106.

By contrast, the control lead 112 of the component 102 does not electrically connect to the busbar structure 104. Rather, due to the control lead being longer than the input lead 110, and to the presence of the opening 116, the control lead reaches the circuit board 106. In some implementations, this connection facilitates control of the component 102. For example, the connection can be made in form of a solder joint 122 between the control lead and a circuit on the board.

Figure 2:
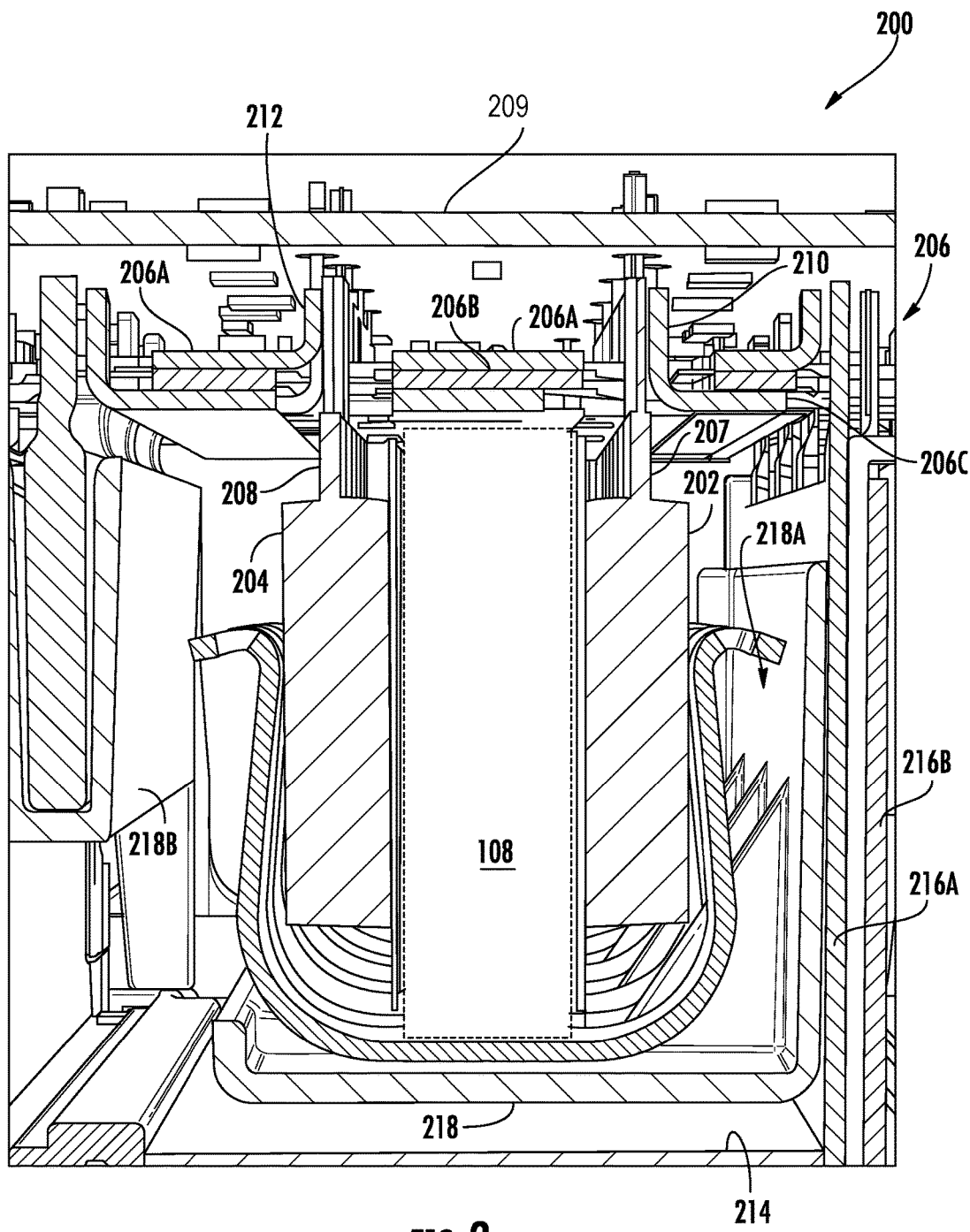
FIG. 2 shows an example of an electronic device having transistors, a laminate busbar structure and a circuit board.

FIG. 2 shows an example of an electronic device 200 having transistors 202 and 204, a laminate busbar structure 206 and a circuit board 209. The transistors in this example can be similar or identical to the components in the above example, and not all features thereof will be explicitly described here. This example illustrates the connection of input/output leads of the transistors. Particularly, an output lead 207 (e.g., a drain) of the transistor 202 is here connected to a busbar layer 206C by way of a tab 210 that together with the lead extends through openings in the other busbar layers 206A-B. Similarly, an output lead 208 (e.g., a drain) of the transistor 204 extends through openings in the three busbar layers and is here connected to the busbar layer 206A by way of a tab 212. That is, the tabs 210 and 212 can be used in forming weld joints between output leads and respective ones of the busbar layers. While only the output leads 207 and 208 are discussed here, it will be understood that the other leads of the transistors 202 and 204 are connected in a corresponding fashion. For example, an input lead of the transistor 202 can be connected to another busbar layer (e.g., layer 206B), and a control lead of the transistor 204 can be connected to the circuit board 209. Similar to the example above, these connections are facilitated by the control lead being longer than the other leads, and by having the tabs 210 and 212 extend the reach of the transistor lead where necessary. The busbar layers are made from a conductive material, such as copper.

The transistors 202 and 204 (and all other ones) can all be placed in a similar spatial arrangement relative to the busbar layers 206A-C. For example, here the transistors are essentially perpendicular to the layers of the busbar structure. In some implementations, the busbar structure can be assembled separately as a layered component (with the layers separated by insulation), and then placed on a busbar locating component so as position the busbar layers and the transistors relative to each other. In other implementations, each busbar layer can be assembled onto a busbar locating component sequentially.

The electronic device 200 also has a capacitor 214 with respective terminals 216A and 216B. For example, this can be a DC link capacitor when the electronic device is a power inverter that converts DC to AC, such as for an electric motor. The terminals 216A-B can have respective leads or tabs at their ends. For example, this can facilitate connection of the capacitor to the busbar layers 206A-C.

The electronic device 200 can also make use of a busbar locating component 218. For example, a component 218A thereof can serve to define a bay for mounting the assembly of the heatsink 108 and the transistors 202 and 204. As another example, one or more slots 218B in the busbar locating component can help position busbars (e.g., AC or DC busbars) relative to the other components of the electronic device. The busbars are made from a conductive material, such as copper.

Figure 3:
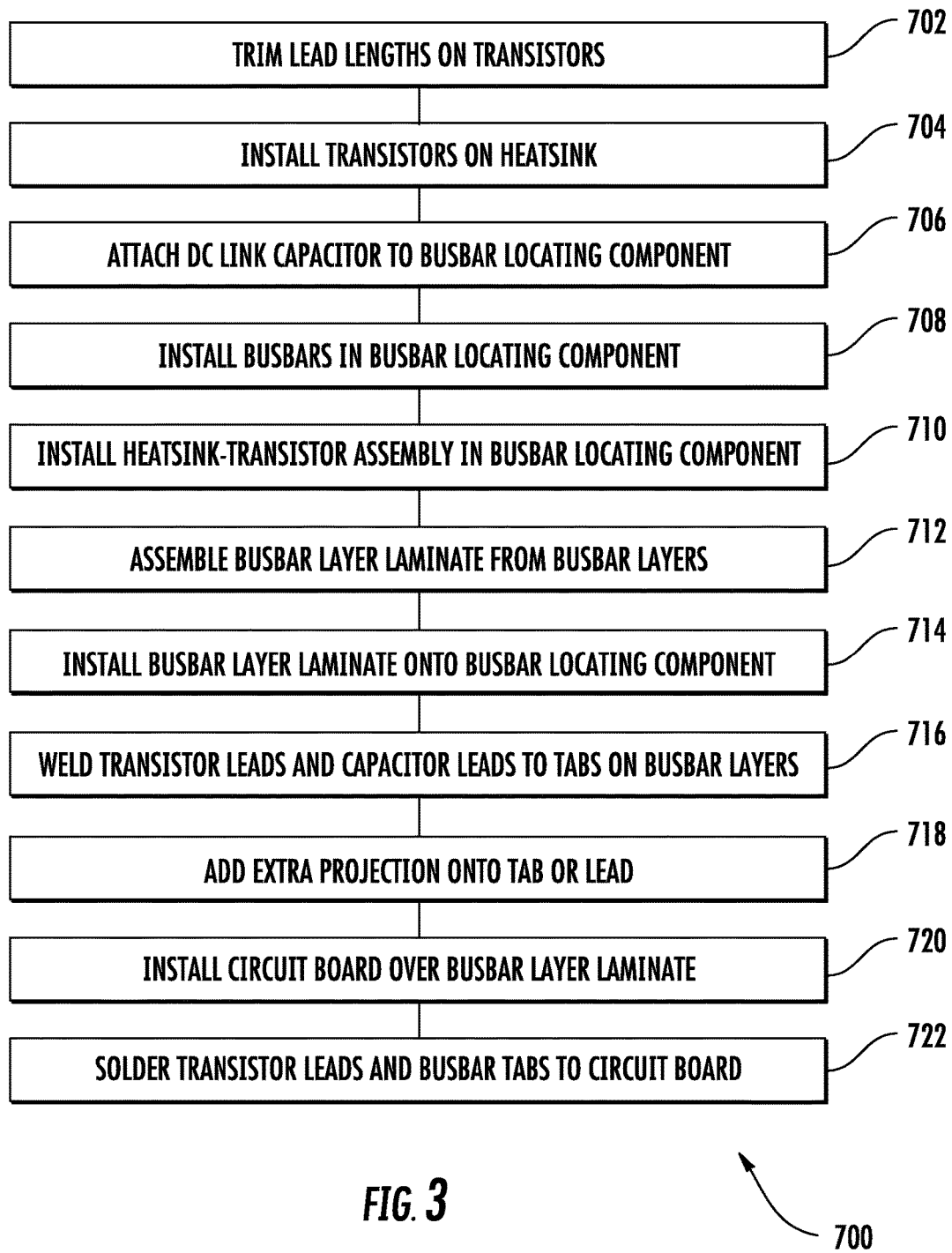
FIG. 3 is a flowchart of an example method of manufacturing an electronic device.

FIG. 3 is a flowchart of an example method 700 of manufacturing an electronic device. The method can be performed in any of a variety of contexts, here the manufacturing of a power inverter will be used as an illustration. Some examples described herein (e.g., FIGS. 1-2 and 4) will be referred to, but the method can be performed also with other types of electronic devices. Steps can be performed manually (i.e., by a person) or robotically, or in a combination thereof. The steps can be performed in a different order unless otherwise stated or indicated.

At 702, lead lengths on transistors are trimmed. The leads are trimmed so that input and output leads are shorter than a control lead. For example, the leads of the transistors 202 and 204 can be trimmed before the transistors are assembled onto the heatsink 108. In other implementations, the transistors can be manufactured to have leads of different length.

At 704, transistors are installed on a heatsink. For example, the transistors 202 and 204 can be assembled onto the heatsink 108 by way of one or more clamps. A protective layer (e.g., a thermally insulating material) can be placed between the transistor and the heatsink.

At 706, a DC link capacitor and a busbar locating component are attached to each other. For example, the busbar locating component 218 can be placed on top of the capacitor 216 so that planar terminals thereof pass through a slot in the busbar locating component.

At 708, busbars are installed in the busbar locating component. For example, DC busbars that provide DC input for an inverter can be installed the slot(s) 218B of the busbar locating component, and AC busbars for carrying AC output from the inverter can be installed in other dedicated slots.

At 710, a heatsink-transistor assembly is installed in the busbar locating component. For example, the heatsink 108 sandwiched between the transistors 202 and 204 can be installed in a bay formed in the busbar locating component.

At 712, a busbar layer laminate is assembled from busbar layers. For example, the layers 206A-C can be stacked on top of each other with insulation layers in between.

At 714, the busbar layer laminate is installed onto the busbar locating component. For example, the layers 206 can be installed so that the leads 207 and 208 pass through the corresponding openings in the busbar layers. Also, tabs or other terminals of a DC link capacitor can similarly pass through other openings in the layers.

At 716, welding can be performed. For example, the output lead 207 can be welded to the tab 210, and the output lead 208 can be welded to the tab 212. Similarly, tabs of the terminals of a DC link capacitor can be welded to other corresponding tabs.

At 718, extra projection can be added onto one or more tabs and/or leads. For example, an input/output tab that is too short to reach the circuit board can be extended by attaching a metal tab to its end.

At 720, a circuit board is installed over the busbar layer laminate. For example, the circuit board 208 can be attached to the same busbar locating component as the layers 206A-C.

At 722, soldering can be performed. For example, control leads of transistors and tabs extending from input/output leads of transistors can be soldered to the circuit board 208.

More or fewer steps can be performed in some implementations.

Figure 4:
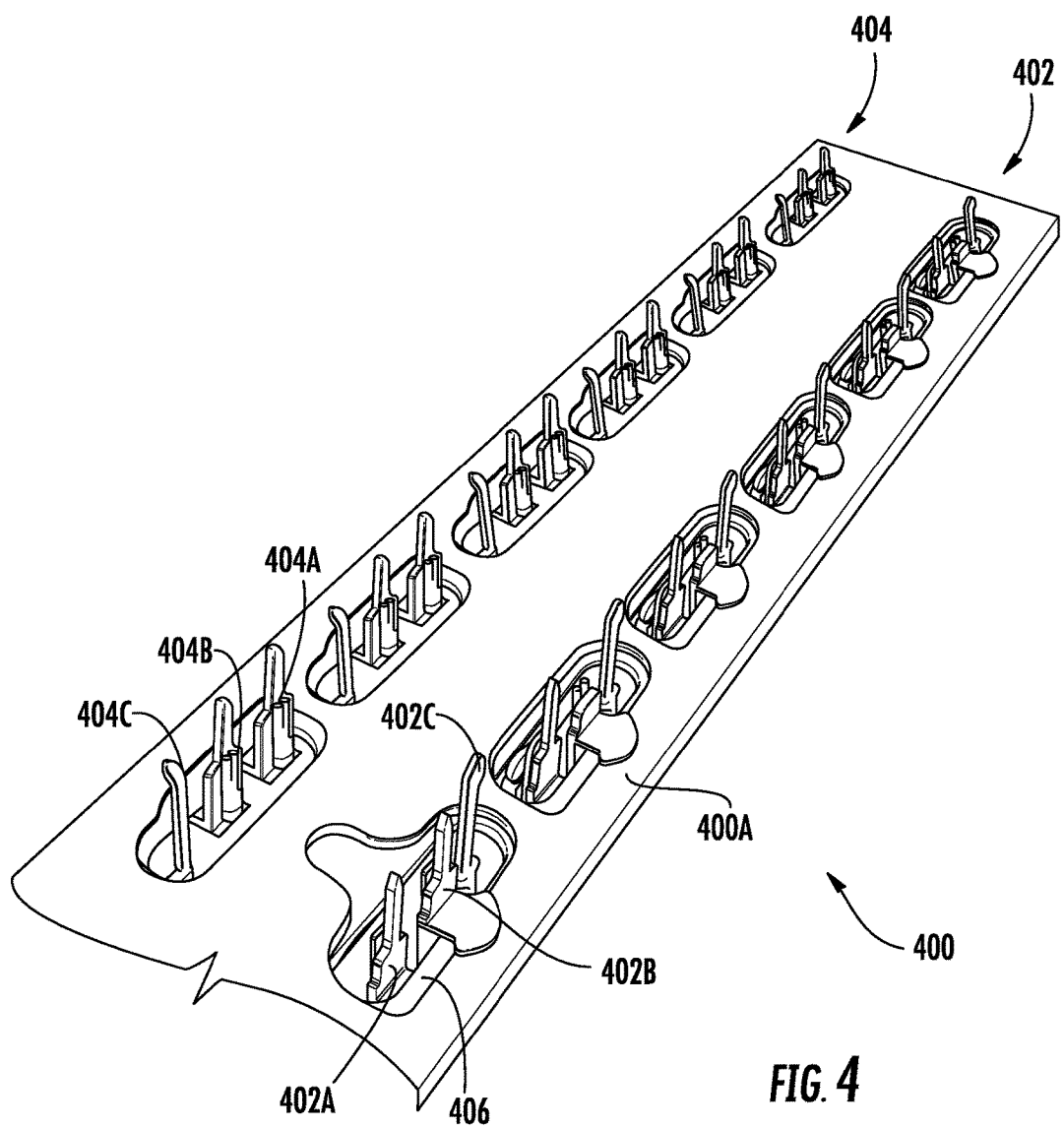
FIG. 4 shows an example of a laminate busbar structure having leads for transistors extending therethrough.

FIG. 4 shows an example of a laminate busbar structure 400 having leads 402 and 404 for transistors extending therethrough. Generally, the leads 402 are from a first set of transistors mounted on one side of a heatsink, and the leads 404 are from a second set of transistors mounted on the other side of the heatsink. For example, input lead 404A and output lead 404B are seen to be shorter than a corresponding control lead 404C of the same transistor.

Among the leads 402, it is seen that a tab 402A is an extension of an input lead from one transistor, and a tab 402B is an extension of an output lead from the same transistor. The tab 402A extends from the periphery of an opening formed in a busbar layer that is here obscured by an insulating layer 406. A tab 402B, on the other hand, extends from the periphery of an opening formed in a busbar layer 400A that is at the top of the laminate busbar structure 400. A lead 402C, finally, is the unmodified control lead extending from the same transistor; this lead does not electrically connect to any of the busbar layers in this example.

A number of implementations have been described as examples. Nevertheless, other implementations are covered by the following claims.

What is claimed is:

1. A method of manufacturing an electronic device, the method comprising:
   positioning a transistor having respective input, output and control leads extending parallel to each other, the control lead longer than the input and output leads;
   placing at least first and second busbar layers relative to the transistor so that each of the input, output and control leads extend through a first opening in the first busbar layer and through a second opening in the second busbar layer, the first and second busbar layers placed so that a first tab extending from the first opening aligns with and contacts one of the input and output leads, and so that a second tab extending from the second opening aligns with and contacts another one of the input and output leads;
   welding the first tab and the one of the input and output leads to each other, and the second tab and the other one of the input and output leads to each other;
   placing a circuit board parallel to the first and second busbar layers so that the control lead and at least one of the first and second tabs extend through corresponding openings in the circuit board; and
   soldering the control lead and the at least one of the first and second tabs to one or more circuits on the circuit board.

2. The method of claim 1, wherein placing the first and second busbar layers relative to the transistor comprises positioning the first busbar layer relative to the transistor, placing an insulation layer on the positioned first busbar layer, and placing the second busbar layer on the placed insulation layer.

3. The method of claim 1, wherein the electric device comprises multiple transistors having respective input, output and control leads extending parallel to each other, wherein the first and second busbar layers are placed in a corresponding way relative to all of the transistors.

4. The method of claim 3, wherein the first and second busbar layers are initially assembled into a laminate busbar structure where they are separated by insulation, and wherein the laminate busbar structure is placed relative to the transistor before welding the first and second tabs.

5. The method of claim 1, wherein the input, output and control leads are initially of equal length, the method further comprising shortening the input and output leads.

6. An electronic device comprising:
   a transistor having respective input, output and control leads extending parallel to each other, the control lead longer than the input and output leads;
   at least first and second busbar layers placed relative to the transistor so that each of the input, output and control leads extend through a first opening in the first busbar layer and through a second opening in the second busbar layer, the first and second busbar layers placed so that a first tab extending from the first opening aligns with and contacts one of the input and output leads, and so that a second tab extending from the second opening aligns with and contacts another one of the input and output leads;

a circuit board placed parallel to the first and second busbar layers so that the control lead and at least one of the first and second tabs extend through corresponding openings in the circuit board;

wherein the first tab and the one of the input and output leads are connected to each other by a first weld joint, and the second tab and the other one of the input and output leads are connected to each other by a second weld joint; and wherein the control lead and the at least one of the first and second tabs are connected to one or more circuits on the circuit board by solder joints.

7. The electronic device of claim 6, further comprising an insulation layer separating the first busbar layer from the second busbar layer.

8. The electronic device of claim 6, wherein the transistor is essentially perpendicular to each of the first and second busbar layers and the circuit board.

9. An electronic device comprising:
a transistor having respective input, output and control leads extending parallel to each other, the control lead longer than the input and output leads;
at least first and second busbar layers placed relative to the transistor so that each of the input, output and control leads extend through a first opening in the first busbar layer and through a second opening in the second busbar layer, the first busbar layer having first means for forming a first weld joint between one of the input and output leads and the first busbar layer, the second busbar layer having second means for forming a second weld joint between another one of the input and output leads and the second busbar layer; and
a circuit board placed parallel to the first and second busbar layers so that the control lead and at least one of the first and second means extend through corresponding openings in the circuit board, wherein the control lead and the at least one of the first and second means are connected to one or more circuits on the circuit board by solder joints.

10. The electronic device of claim 9, wherein the first means comprises a first tab extending from the first opening.

11. The electronic device of claim 10, wherein the first tab extends from a periphery of the first opening and is essentially parallel with the one of the input and output leads.

12. The electronic device of claim 10, wherein the second means comprises a second tab extending from the second opening.

13. The electronic device of claim 12, wherein the second tab extends from a periphery of the second opening and is essentially parallel with the other one of the input and output leads.

14. The electronic device of claim 9, wherein both of the first and second means extend through the corresponding openings in the circuit board and are connected to one or more circuits on the circuit board by solder joints.

* * * * *